United States Patent [19]

Fechner et al.

[11] Patent Number: 5,566,316
[45] Date of Patent: Oct. 15, 1996

[54] METHOD AND APPARATUS FOR HIERARCHICAL MANAGEMENT OF DATA STORAGE ELEMENTS IN AN ARRAY STORAGE DEVICE

[75] Inventors: Jimmy R. Fechner, Lafayette; Thai Nguyen, Thornton; Robert M. Raymond, Boulder, all of Colo.

[73] Assignee: Storage Technology Corporation, Louisville, Colo.

[21] Appl. No.: 606,223

[22] Filed: Feb. 23, 1996

Related U.S. Application Data

[63] Continuation of Ser. No. 194,480, Feb. 10, 1994, abandoned.

[51] Int. Cl.⁶ .................................................. G06F 11/14
[52] U.S. Cl. ................... 395/441; 395/182.04; 371/40.1; 364/944.92; 364/952.1; 364/964; 364/966.2; 364/DIG. 2
[58] Field of Search .................... 395/182.03–182.06, 395/404, 439, 441, 444, 497.01, 800, 827, 835, 856; 371/2.2, 10.1, 11.4, 40.1; 365/189.04, 230.01, 230.03

[56] References Cited

U.S. PATENT DOCUMENTS

| | | | |
|---|---|---|---|
| 5,077,736 | 12/1991 | Dunphy, Jr. et al. | 371/10.1 |
| 5,247,632 | 9/1993 | Newman | 395/400 |
| 5,265,104 | 11/1993 | Weng | 371/40.1 |
| 5,357,509 | 10/1994 | Ohizumi | 395/182.05 |
| 5,392,244 | 2/1995 | Jacobson et al. | 395/441 |
| 5,398,253 | 3/1995 | Gordon | 371/40.4 |
| 5,412,661 | 5/1995 | Hao et al. | 371/10.1 |
| 5,477,552 | 12/1995 | Nishiyama | 371/40.1 |
| 5,506,979 | 4/1996 | Menon | 395/439 |

FOREIGN PATENT DOCUMENTS

| | | |
|---|---|---|
| 0450801 | 3/1991 | European Pat. Off. . |
| 0481759 | 10/1991 | European Pat. Off. . |
| 0521630 | 6/1992 | European Pat. Off. . |

*Primary Examiner*—Alpesh M. Shah
*Attorney, Agent, or Firm*—Duft, Graziano & Forest, P.C.

[57] ABSTRACT

The data storage subsystem is implemented using redundancy groups of data storage modules, at least one module of which comprises a plurality of data storage elements. In this manner, the one dimensional data storage module redundancy group is expanded in another dimension by the use of a plurality of storage elements to implement each of the data storage modules. Enhanced performance is obtained by having more actuators concurrently accessing data. The reconstruction of data due to an equipment failure is therefore localized to a data storage element rather than requiring the replacement of an entire data storage module.

3 Claims, 5 Drawing Sheets

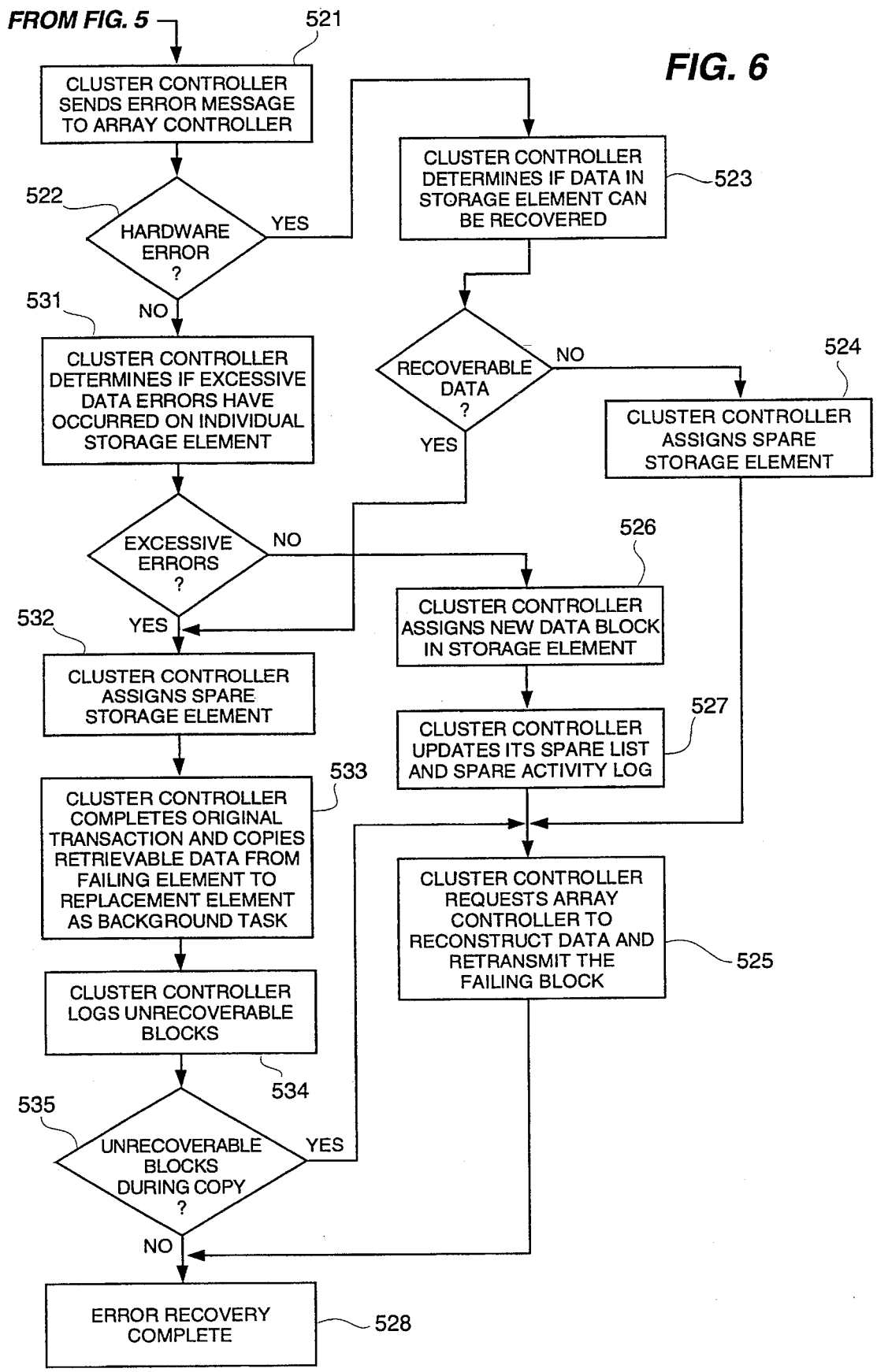

METHOD AND APPARATUS FOR HIERARCHICAL MANAGEMENT OF DATA STORAGE ELEMENTS IN AN ARRAY STORAGE DEVICE

This application is a file wrapper continuation of application Ser. No. 08/194,480, filed Feb. 10, 1994, now abandoned.

FIELD OF THE INVENTION

This invention relates to data storage subsystems and, in particular, to a disk drive array data storage subsystem that incorporates a hierarchical arrangement of managing spare data storage elements for the disk drive array.

PROBLEM

It is a problem in data storage subsystems to provide a significant data storage capability having high reliability, high performance and at a low cost. Traditionally, large form factor disk drives were used for this purpose because these elements have a significant data storage capacity and high reliability, but these are expensive devices. The reliability in these devices is obtained by the use of precisely manufactured elements. In addition to the cost factor, the high performance disk drives encounter a constraint imposed by the large amount of data that is accessed by each actuator in the read/write mechanism. There is an unavoidable delay in retrieving data from the data storage medium because access to the data is serial in nature. The actuator limitation can be overcome by placing less data under each actuator, however, the high cost of this apparatus makes this an impractical solution.

An alternative to the large form factor disk drives is the use of a disk array that consists of a plurality of small form factor disk drives interconnected into a redundancy group. A redundancy group comprises n disk drives that are used to store data and m disk drives that are used to store redundancy information. As data is written onto the n data storage disk drives, redundancy information is computed across these n sets of data for reliability purposes. Redundancy information is stored on the m redundancy disk drives and is available to reconstruct data on one or more of the n data disk drives should these devices fail. Therefore, the data storage capacity of the large form factor disk drives can be matched by the disk drive array. To overcome this reliability degradation, the reliability of the small form factor disk drives is better than that of large form factor disk drives, but the composite reliability is reduced when a large number of the small form factor disk drives is used to implement the data storage subsystem. If a disk drive in the redundancy group fails, the storage controller reconstructs the data that was stored on this failed disk drive by making use of the n-1 remaining disk drives and the redundancy information stored on the m redundancy disk drives. Using well-known data reconstruction techniques, the data that was stored on the failed disk drive can be recreated and is stored on a spare disk drive that is used to replace the failed disk drive. The spare disk drive can be part of the redundancy group or can be one of a plurality of spare drives that are part of a pool of spare drives shared among a plurality of redundancy groups.

One problem with the disk drive array configuration is that the data storage capacity of the small form factor disk drives is increasing at a significant rate, and the data stored in a redundancy group represents a significant amount of information. When a disk drive in the redundancy group fails, the entire disk drive may not be affected; only a portion of the data storage media may fail to operate. Therefore, only a small portion of the data that is stored on the failed disk drive needs to be reconstructed, but it is difficult to identify a partition of the entire data that is stored on the disk drive that requires reconstruction, and therefore existing systems simply reconstruct all of the data on the entire disk drive. It is obvious that using the redundancy information and the information on the n-1 remaining disk drives to reconstruct the data on the failed disk drive represents a significant processing task and can take a significant amount of time to accomplish. The magnitude of this problem is anticipated to increase over time as the data storage capacity of the commodity small form factor disk drives that are used to implement the disk drive array continues to increase with advances in technology. Therefore, the increased storage capacity of a disk drive enhances the data storage capacity of the disk drive array but at the same time increases the effort required to reconstruct a failed disk drive since there presently is no method to efficiently identify only that segment of data on the failed disk drive that requires reconstruction. In addition, if the entire disk drive fails, the availability of a partitioning capability would not be beneficial since the entire disk drive must be reconstructed.

SOLUTION

The above-described problems are solved and a technical advance achieved in the field by the hierarchical spare management capability of a data storage subsystem that makes use of an array of data storage elements as the data storage modules in the array architecture. In particular, a plurality of data storage modules is interconnected to form an array, with at least one of these modules being implemented by interconnecting a plurality of data elements. The resultant data module may emulate the other data module in the array, or all data modules may be comprised of a plurality of data elements. This architecture improves the mean time to data loss, improves the input/output performance of the memory, and reduces the time required to reconstruct data lost when a data storage element fails.

It is well-known that there are significant advantages to be obtained by the use of an array architecture for a data storage subsystem. While the arrays presently in use are implemented with commodity 5.25" and 3.5" form factor disk drives, the basic array architecture is applicable to all sorts of data storage elements. Therefore, the device, regardless of technology, that is used to implement the basic building block in the array architecture is referred to herein as a data storage element. The data storage element can be a commodity small form factor disk drive, such as the 5.25" and 3.5" hard disk drives used in personal computer systems, or it can be optical disks, 5.25" form factor hard disk drives, 1.3" form factor hard disk drives, magnetic tape drives, semi-conductor memory, or any other such data storage element.

The data that is written to a data storage module is distributed among all the data storage elements that comprise the data storage module to uniformly utilize these elements and also improve the data input/output performance. It is also well-known from reliability theory that the mean time to, failure of a plurality of identical interconnected elements is obtained by dividing the mean time to failure of one of the elements by the number of elements so interconnected. Therefore, the reliability of a disk drive array having n disk drives connected in parallel is equal to 1/n the reliability of a single one of the disk drives used to implement the disk drive array. Therefore, data reconstruction activity can take place more frequently in an array-type structure than in the large form factor disk drives. The minimization of this data reconstruction activity is important to maintain the performance of the array, and reconstructing only the minimum amount of data necessary significantly enhances this performance. With the data storage capacity of commodity disk drives increasing significantly, the use of data storage elements of compact size, low cost and small data storage capacity relative to the larger form factor elements allows the data storage subsystem to localize the data reconstruction activity to the minimal data set that is required to be repaired.

This improved data reconstruction capability is obtained by implementing each data storage module in the redundancy group by a group of data storage elements. Each group of data storage elements can include spare data storage elements so that data reconstruction activity can be accomplished within a data storage module, and focused on a single data storage element contained therein. This improves the data reconstruction time when a data failure occurs by localizing the reconstruction activity to a finer granularity than in prior array data storage subsystems. A hierarchical spare device management system is thereby provided, with spare data storage elements being provided for the group of data storage elements that implements a data storage module, as well as spare data storage modules being provided for the redundancy group of data storage modules.

BRIEF DESCRIPTION OF THE DRAWING

FIGS. 5 and 6 illustrate in flow-diagram form the operational steps taken by the data storage subsystem to perform data read/write and reconstruction activity.

DETAILED DESCRIPTION OF THE DRAWING

Figure 1:
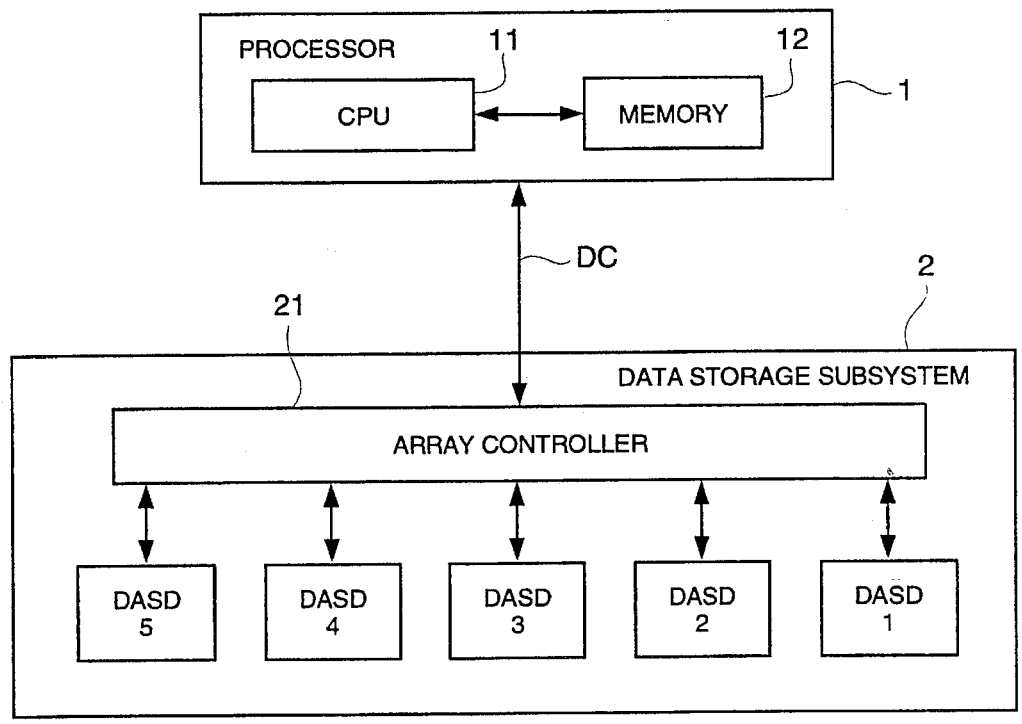
FIG. 1 illustrates in block diagram form the overall architecture of an array disk storage subsystem.

FIG. 1 illustrates in block diagram form the architecture of a typical prior art disk drive array data storage subsystem. A data processing system 1, consisting of a central processing unit (CPU) 11 and its associated internal memory 12, is connected via a data channel DC to a disk drive array data storage subsystem 2. The implementation of data storage subsystem 2 is a disk array that consists of an array controller 21 and a plurality of DASD devices (DASD1–DASD5) that are directly connected to array controller 21. The data storage subsystem 2 can be, for example, any RAID architecture as is well known in the field, with the data received from data processing system 1 as well as redundancy information generated by array controller 21 being stored on the data storage devices DASD1–5.

Figure 2:
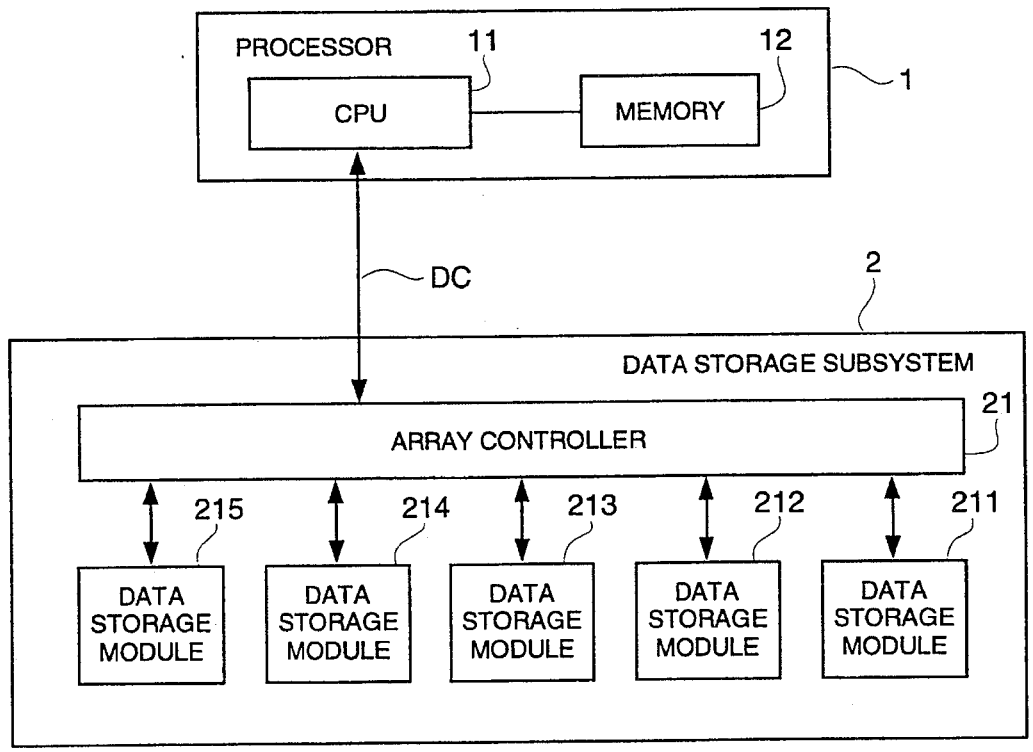
FIG. 2 illustrates in block diagram form the overall architecture of an array disk storage subsystem that includes the apparatus of the present invention.
Figure 3:
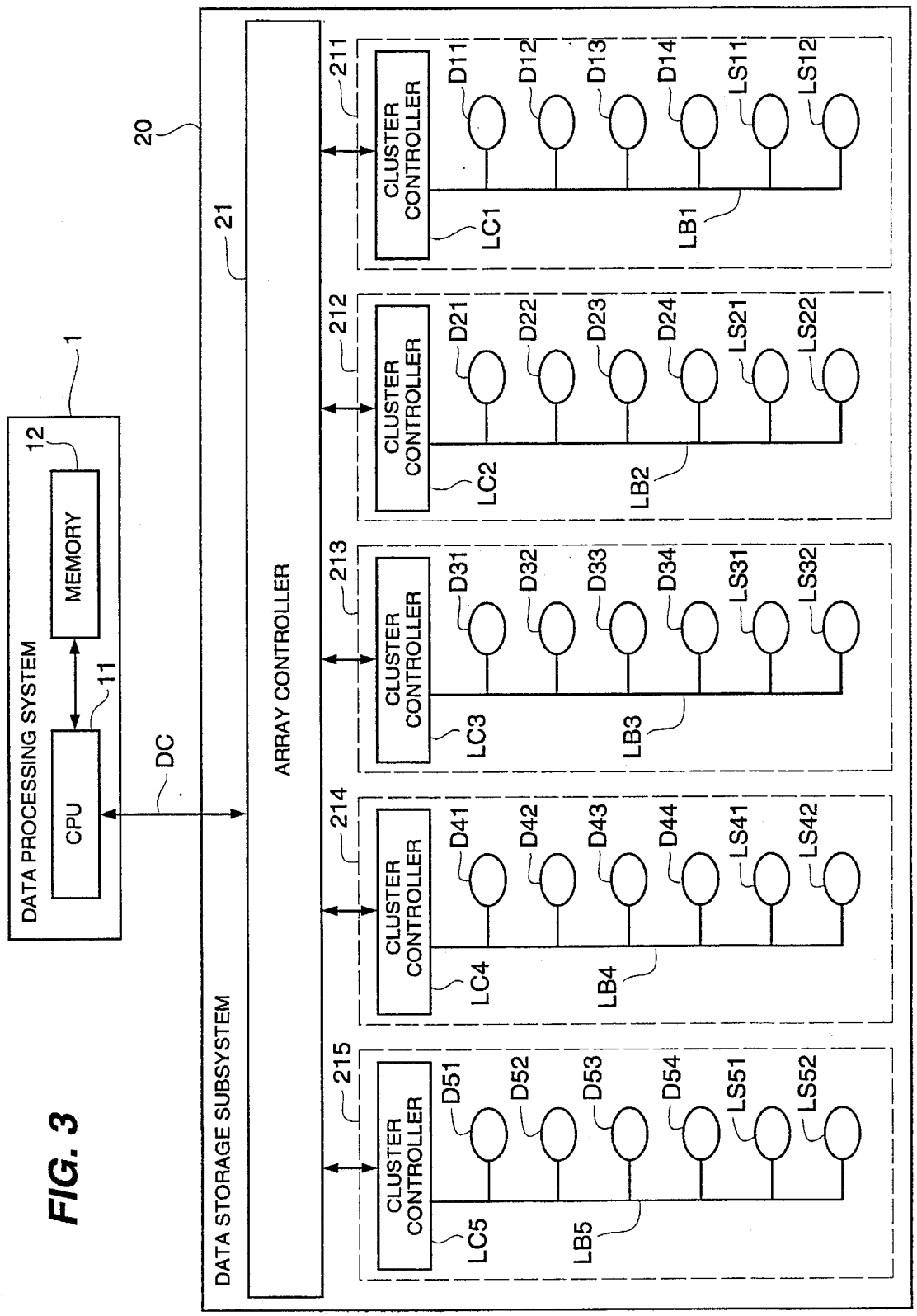
FIG. 3 illustrates additional details of the data storage module used in the data storage subsystem of the present invention.

The data storage subsystem of the present invention is illustrated in block diagram form FIG. 2, wherein the basic data storage subsystem architecture is similar to that of conventional disk drive array data storage subsystems, such as that illustrated in FIG. 1. However, a significant departure from conventional array memory systems is in the implementation of the data storage modules 211–215. As shown in FIG. 3 in additional detail, the data storage subsystem 20 of the present invention implements at least one of the data storage modules 211–215 using a plurality of data storage elements. The data storage modules 211–215 are configured into at least one redundancy group of data storage modules 211–215 to store data and associated redundancy information thereon. The redundancy group is shown as comprising four data storage modules 211–214 used to store the data and redundancy information and a spare data storage module 215. For simplicity of description, only a single redundancy group is illustrated in detail in FIG. 3 although it is evident that a plurality of redundancy groups in a data storage subsystem are more typical. As shown in FIG. 3, at least one data storage module (for example 211) in the redundancy group of data storage modules 211–215 itself consists of a plurality of data storage elements (D11–LS12) which includes at least one backup data storage element LS11–LS12. Each physical data storage element D11–LS12 is designed so that it can detect a failure in its operation, which allows the redundancy segments stored in the data storage module redundancy group 211–215 to be used for multi-bit error correction of a failed data storage element, for example D11. Identification of the failed physical data storage element D11 by cluster controller LC1 provides information on the bit position of the errors in the redundancy group and the redundancy data provides information to correct the errors. Once a failed data storage element D11 in a data storage module 211 is identified, a backup data storage element LS11 is automatically switched in place of the failed data storage element D11. Control circuitry in array controller 21 reconstructs the data stored on the failed data storage element D11, using the data and redundancy information stored on the data storage elements D21, D31, D4 in the other data storage modules 212–214 in the redundancy group. A failure in the redundancy segments does not require data reconstruction, but necessitates regeneration of the redundancy information. The reconstructed data is then written onto the substitute data storage element LS11. The use of backup data storage elements in each data storage module 211–215 increases the system reliability and reduces the time required to reconstruct lost data since the failure is localized to a single data storage element D11 in a group of data storage elements, which group constitutes one data storage module 211 in a redundancy group of data storage modules 211–215.

On the data storage module level, either each redundancy group includes at least one backup data storage module 215 or a plurality of data storage modules are dedicated as backup data storage modules in a pool of backup devices shared among all the data storage module redundancy groups in the data storage subsystem 20. this further improves system performance by providing a hierarchically senior level of reliability above the module-level spare data storage elements. In addition, a failure of a major system component, such as a cluster controller, can be recovered by the use of backup data storage modules 215 in the redundancy groups of data storage modules.

Disk Drive Implementation of Data Storage Elements

Each of the data storage elements D11–LS12 in data storage module 211 can be implemented by a disk subsystem that consists of a disk drive mechanism and its surrounding control and interface circuitry. The disk drive consists of a commodity disk drive which can be a commercially available hard disk drive of the type that typically is used in personal computers. A control processor associated with the disk drive has control responsibility for the entire disk drive and monitors all information routed over the various serial data channels that connect each disk drive to drive circuits. Any data transmitted to the disk drive over these channels is stored in a corresponding interface buffer which is connected via an associated serial data channel to a corresponding serial/parallel converter circuit. A disk controller is also provided in each disk drive to implement the low level electrical interface required by the commodity disk drive. The commodity disk drive has a standard interface which must be interfaced with drive circuits. The disk controller provides this function. Disk drive controller provides serialization and deserialization of data, CRC/ECC generation, checking and correction and data encoding. The addressing information such as the head select and other type of control signals are provided by drive circuits to commodity disk drive D11. This communication path is also provided for diagnostic and control purposes. For example, drive circuits can power a commodity disk drive down when the disk drive is in the standby mode. In this fashion, commodity disk drive remains in an idle state until it is selected by drive circuits.

Cluster Controller

The cluster controller LC1 is connected to the plurality of data storage elements D11–D14 by one or more data paths LB1. The cluster controller LC1 presents its associated data storage elements (such as disk drives) D11–D14 to the array controller 21 as a single disk drive. Hence, it has all the functionality of a conventional disk drive unit. These functionalities include, but are not limited to, one or more standard disk drive interfaces, managing the mapping and distribution of data blocks to the disk drives D11–D14 in the data storage module 211. The individual disk drives are typically designed to be replaced while the data storage system 20 is on-line without interrupting service.

In addition to these conventional functions, the cluster controller LC1 maintains status information for each disk drive D11–LS12 in the data storage module 211. On power up, the cluster controller 21 queries each individual disk drive D11–LS12 in the data storage module 211 and stores this information in a table of pointers, each of which points to an individual disk drive's information list. Typical information includes the disk drive's serial number, its data storage capacity, number of defect sectors, error statistics, etc. This information can also be obtained by the cluster controller LC1 at any time by simply polling the individual disk drive. Based on the number of defect sectors and the associated error statistics, the cluster controller LC1 can generate a prediction of when the disk drive (such as D11) is likely to fail. The cluster controller LC1 can use this failure prediction to proactively copy all the valid data from this disk drive D11 to a selected local spare LS11 within the data storage module 211. Thus, the cluster controller LC1 can relieve the array controller 21 of data reconstruction activity by this preemptive data storage element replacement. If a disk drive D11 fails prior to a failure prediction indicating such a problem, the cluster controller LC1 notifies the array controller 21 of the failure and the array controller 21 regenerates the lost data for the failed disk drive D11. The array controller 21 then transmits the regenerated data to the cluster controller LC1 for storage on one of the local spare disk drives LS11, LS12 within the data storage module 211. When all of the local spare drives LS* are expended or the cluster controller LC1 fails, the array controller 21 must regenerate all the data stored in the data storage module 211 and write the regenerated data in a spare data storage module 215.

Data input/Output Process

The array controller 21 has control over all data reconstruction activity in the data storage subsystem 20. This reconstruction activity includes reconstruction of a data storage module 211 in a redundancy group as well as a reconstruction of a data storage element D11 in a data storage module 211. The array controller 21 also controls the operation of each data storage module 211–215, monitors the performance of each data storage module 211–215, and invokes maintenance activity when deemed appropriate. The cluster controller LC* in each data storage module 211–215 or even the controller circuitry in the individual data storage elements D11–LS12 performs the file relocation and sector sparing tasks. The local controller LC* updates system status and maintains logs of read/write error activity for all of the data storage elements D11–LS12 in the data storage module 211.

Figure 5:
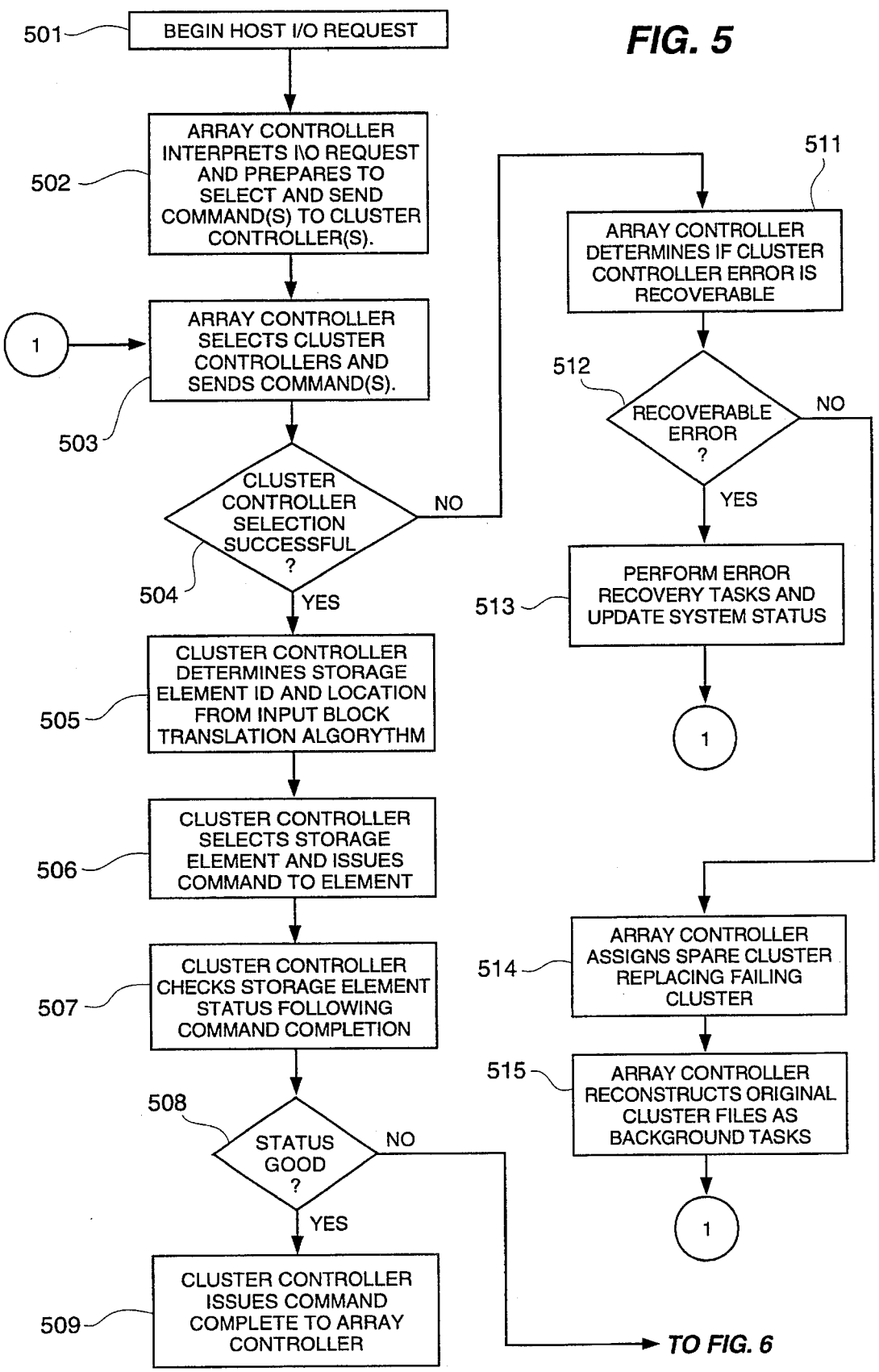

The flow diagrams of FIGS. 5 and 6 illustrate the data input/output process implemented in the data storage subsystem 20 and the various error checking procedures that are incorporated into this process. At step 501, the host processor initiates and input/output request by transmitting the appropriate commands to the data storage subsystem 20 over a data channel DC. At step 502, the array controller 21 interprets the received commands and in turn generates corresponding control instructions that are to be sent to selected cluster controllers to implement the input/output request received from the host processor 1. At step 503, the array controller 21 selects one of the cluster controllers LC1–LC5 to be the recipient of the generated control instructions. The array controller 21 transmits these instructions to the selected cluster controllers. At step 504, array controller 21 determines whether this cluster controller selection process has been successfully effected, based on the messages that are exchanged between the array controller 21 and the selected cluster controller LC1. If the selection process has failed, at step 511 array controller 21 determines whether the cluster controller error is a recoverable error. At step 512, array controller 21 selects one of two response paths based on the recoverability of the error. If the error is recoverable, at step 513 array controller performs the required error recovery process, as required by the nature of the failure, and control then returns to step 503. If the error is not recoverable, at step 514 array controller 21 selects a spare data storage module 215 to replace the data storage module 211 that contains the failed cluster controller LC1. At step 515 array controller 21 reconstructs, as a background task, the data that is stored in the data storage module 211 that contains the failed cluster controller LC1. This reconstructed data is then written into the selected replacement data storage module 215 at the same virtual address as it was originally stored in the failed data storage module 211.

If the cluster controller selection at step 504 is successful, processing advances to step 505 where the selected cluster controller LC1 determines the identification of a selected data storage element contained in data storage module 211 that is the target available memory space into which the received data is written or the selected data is read from. This space identification is accomplished by a mapping of the received address to a physical address location, as is described in greater detail hereinbelow. At step 506, cluster controller LC1 selects the identified data storage element D11 and issues the appropriate read/write commands to this element. Cluster controller LC1 at step 507 checks the status of the selected data storage element D11 upon completion of the command transmission to determine whether an error has occurred. A status check is performed at step 508 to determine whether corrective action-is required. If no error occurred, at step 509 cluster controller LC1 issues a command to the array controller 21 indicative of the successful completion of the requested action.

If an error is detected at step 508, processing advances to step 521 where cluster controller LC1 transmits an error message to array controller 21. At step 522 a determination is made whether the detected error is a hardware error. If a hardware error has occurred, at step 523 cluster controller LC1 determines whether the data stored in the failed data storage element D11 can be recovered. If not, at step 524 cluster controller LC1 assigns a spare data storage element LS11 from the data storage module 211 to replace the failed data storage element D11. Cluster controller LC1 then at step 525 transmits a request to array controller 21 to reconstruct the lost data and transmit the reconstructed data to cluster controller LC1 for storage on the replacement data storage element LS11.

At step 522 if no hardware error occurred, processing advances to step 531 where cluster controller LC1 determines whether excessive data errors have occurred on the data storage element D11 that was selected to service the request that was transmitted by the host computer. If excessive data errors have not occurred, processing advances to step 526 where cluster controller LC1 assigns a new data block in the selected data storage element D11 to store the data that was stored or was scheduled to be stored in the selected data block when the error occurred. At step 527, cluster controller LC1 updates the spare available memory space list and spare activity log to record the assignment of the new data block to replace the failed data block. Cluster controller LC1 at step 525 transmits a request to array controller 21 to reconstruct the failed data and transmit the reconstructed data to cluster controller LC1 for storage on the new data block.

If, at step 531, cluster controller LC1 determines excessive data errors have occurred on the data storage element that was selected to service the request that was transmitted by the host computer 1, processing advances to step 532 where cluster controller LC1 assigns a spare data storage element LS11 to replace the selected data storage element D11. At step 533, cluster controller LC1 completes the original transaction as requested by array controller 21 and copies all recoverable data from the failed data storage element D11 to the replacement data storage element LS11 as a background task. At step 534, cluster controller LC1 logs all unrecoverable blocks that were discovered in the data copy operation of step 533 and determines at step 535 whether any unrecoverable blocks were identified. If no unrecoverable blocks are found, processing exits at step 528 and error recovery is complete. If unrecoverable blocks are found, processing advances to step 525 as noted above where Cluster controller LC1 transmits a request to array controller 21 to reconstruct the failed data and transmit the reconstructed data to cluster controller LC1 for storage on the replacement data storage element LS11.

Various Failure Modalities

An example of data reconstruction activity is the failure of a sector on a data storage element D11 within a particular data storage module 211. The failure of a sector on a disk drive that comprises a data storage element D11 in a data storage module 211 is typically detected during a data read operation. When the requested data block cannot be retrieved from the identified data storage location on the disk drive, the disk drive controller that is integral to the disk drive performs internal testing to determine whether the sector that contains the requested data is unrecoverable. If so, the disk drive controller signals the cluster controller LC1 to indicate the presence of an unrecoverable sector on the disk drive. The cluster controller LC1 transmits this error information to the array controller 21, which responds by transmitting control information to the cluster controller LC1 to indicate that the failed disk drive D11 should relocate the data to a new sector on the data storage media. The array controller 21 provides the lost data by reconstruction the data from the redundancy information stored in the redundancy group 211–214. This is accomplished by reading data from each data storage module 211–214 in the redundancy group, which data all has the same logical address as the lost sector on the failed disk drive D11. The redundancy data, combined with the remaining good data from the other data storage modules 212–214 in the redundancy group, enable the array controller 21 to reconstruct the lost sector on the failed disk drive D11. Thus, only a single sector on a single data storage element D11 in a single data storage module 211 need be reconstructed with this hierarchical data storage architecture. The array controller 21 transmits the reconstructed sector to the cluster controller LC1, which forwards this data to data storage element D11. This reconstructed sector is rewritten by the disk drive of the data storage element D11 on to a new site on the data storage media and the failed sector blocked out in the bad sector table of the memory management unit of the disk controller. Once the reconstructed data is written on the new sector, the cluster controller LC1 concludes the reconstruction activity by updating all error logs and status fields.

If this error represents the latest of a number of errors for this data storage element D11, a determination is made whether this data storage element D11 has exceeded the threshold for reliable operation. If an excessive failure rate is determined by the local controller on the data storage elements or by cluster controller 21, a data storage element replacement activity is initiated. This is accomplished by the cluster controller LC1 transmitting control messages to the array controller 21 instructing it to send a copy command to the cluster controller LC1 to copy the readable sectors of the failed data storage element D11 to a selected spare data storage element LS11. The cluster controller LC1 reads each sector seriatim from the identified failed data storage element D11 and writes the retrieved data on to the data storage media of the spare data storage element LS11 of this data storage module 211. The cluster controller LC1 notes the presence and address of any unrecoverable sectors encountered in this sector copy operation. The list of all unrecoverable sectors is transmitted by the cluster controller LC1 to the array controller 21. The array controller 21 reconstructs each unrecoverable sector as noted above and transmits the reconstructed data to the cluster controller LC1 for writing to the replacement disk drive of the spare data storage element LS11.

Another data reconstruction scenario is the failure of a cluster controller LC1 or a plurality of the data storage elements D* within a single data storage module 211. In this case, the array controller 21 detects the presence of a failed cluster controller LC1 or responds to the message from a cluster controller LC1 indicating multiple failed data storage elements D* or failed critical path components within a data storage module 211 by reconstructing all the data stored in the failed data storage module 211. This operation is analogous to the failed disk drive reconstruction of a standard disk drive array. The redundancy data is read from the data storage modules 212–214 along with the remaining good data for each logical address. This information is used in well-known manner to recreate the corrupted data from the failed data storage module 211. In the system of the present invention, the data is read data storage element by data storage element and reconstructed, rather than from a single disk drive as in traditional disk drive arrays. The finer granularity of the reconstruction activity enables the system to more quickly process the reconstruction activity, especially if a number of the data storage elements within the failed data storage module 211 are identified as operational and the data contained thereon is readable. The reconstruction activity takes place on only the minimalistic set of apparatus that has failed and requires reconstruction.

Data Storage Element Addressing

Figure 4:
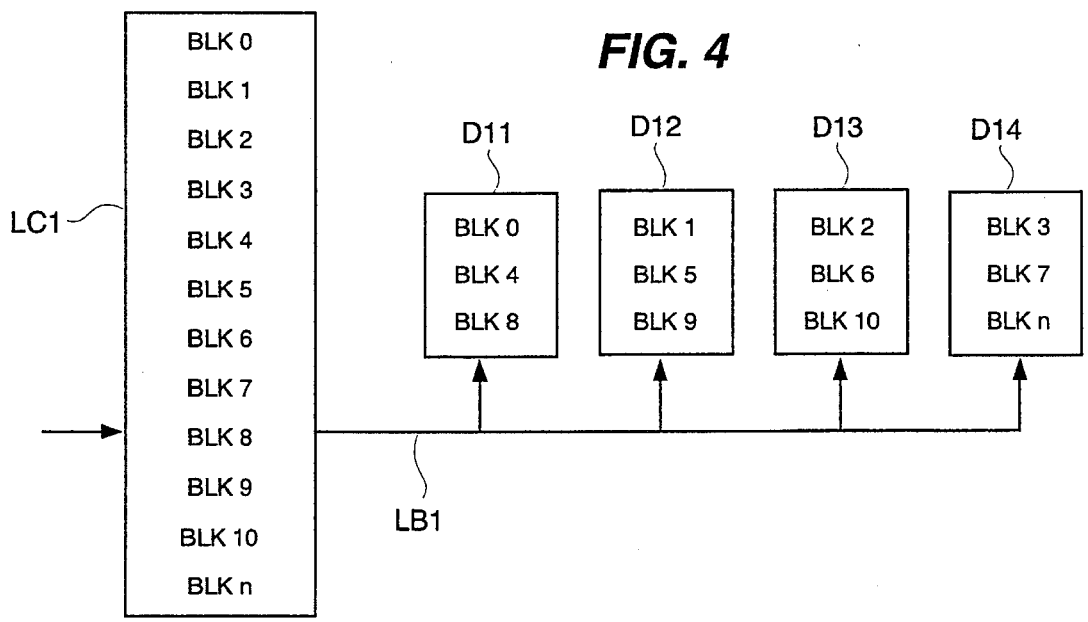
FIG. 4 illustrates a typical addressing convention in a data storage module that is equipped with four data storage elements.
Figure 7:
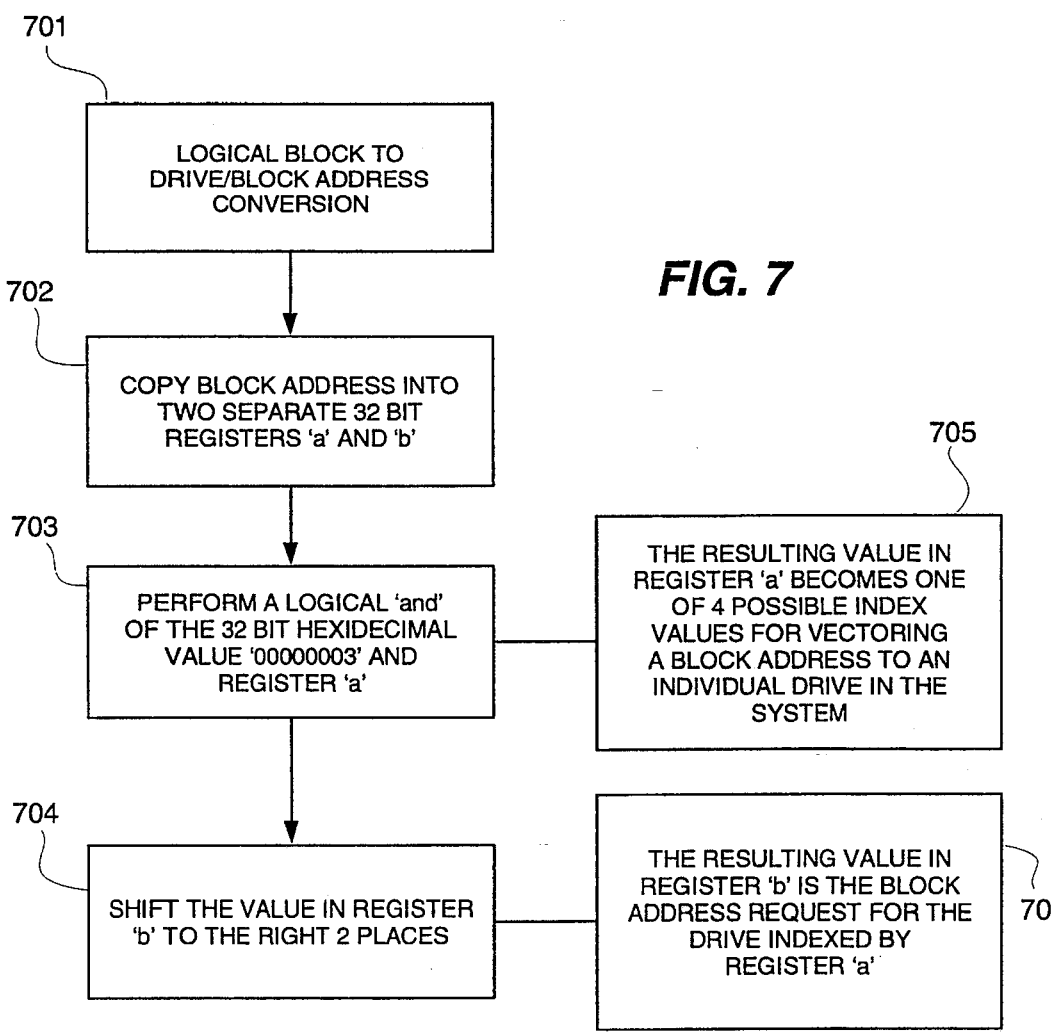
FIG. 7 illustrates in flow diagram form the operational steps taken in the address conversion process.

Data is transmitted by the array controller 21 to a selected cluster controller LC1 which then stores the received data in the plurality of data storage elements D11 to D14 in the data storage module 211. There is a fixed mapping between the address information provided by the array controller 21 and the physical storage location on the plurality of data storage elements D11–D14 in the data storage module 211. The fixed mapping is uniform among all cluster controllers LC1 to LC5 in a redundancy group 211–215 so that the translation between logical address and physical location on a data storage element is known in the event of a failure of a data storage element, or even a local controller. FIG. 4 illustrates a typical fixed mapping arrangement for a data storage module that contains four data storage elements while FIG. 7 illustrates in flow diagram form the operational steps taken by cluster controller LC* to perform the mapping operation. This mapping is but one of the possible mapping algorithms that are possible and is shown here for the purpose of illustration. In particular, the array controller 21 at step 701 provides a logical address for the data that is transmitted to the cluster controller LC1. In this instance, blocks Blk 0 to Blk 'n' are transmitted to the cluster controller LC1. Since there are but four active data storage elements in the data storage module 211, the last two bits of the logical address can be used to select the one of the four data storage elements that receives this block. As can be seen from the figures, Blk 0 is addressed with the logical address that ends in '00' and is therefore written in available memory space in data storage element D11. Subsequently received Blk 1 has a logical address that ends in '01' and is written in available memory space in data storage element D12. This process continues until all the received data is rewritten into the data storage module 211, as shown in FIG. 4.

One method of performing this mapping is at step 702 to copy the block address into two separate 32 bit registers labeled "a" and "b". The cluster controller LC1 performs at step 703 a logical AND of the 32 bit value of hexidecimal '00000003' and the value stored in register 'a'. At step 705, cluster control LC1 uses the resultant value as one of 4 possible index values for vectoring a block address to an individual data storage element D*. Similarly, at step 704, cluster controller LC1 shifts the value stored in register 'b' two places to the right and at step 706 uses the resultant value as the block address request for the data storage element indexed at step 705.

In the event that one of data storage elements D11–D14 fails, the data can be recovered since the mapping between the logical system controller provided address and the physical storage location in data storage module is known. For example, if data storage element D11 fails, the mapping of the logical address to data storage element described above can be used to determine which blocks are stored on data storage element D11. As described above, all blocks with a logical address ending in '00' are stored in data storage element D11. This corresponds to Blk 0, Blk 4, Blk 8 as shown in FIG. 4. The reconstruction process can therefore use the data and redundancy information from the remaining data storage modules in the redundancy group to reconstruct the data stored on this failed data storage element. The remaining data storage modules are addressed at the logical address corresponding to the failed data storage element to retrieve the information necessary to reconstruct the unrecoverable data in well-known fashion.

While a specific embodiment of this invention has been disclosed herein, it is expected that those skilled in the art can design other embodiments that differ from this particular embodiment but fall within the scope of the appended claims.

We claim:

1. A data storage subsystem comprising:

a plurality of data storage elements;

a plurality of cluster controllers each connected to a subset of said plurality of data storage elements for storing information;

means within at least one of said plurality of cluster controllers for controlling a first level redundancy group, wherein said first level redundancy group consists of the connected subset of data storage elements, and wherein N of said data storage elements of said connected subset are used by the connected cluster controller to store data, and wherein M of said data storage elements of said connected subset are used by the connected cluster controller to store redundancy information, and wherein at least one of said connected subset of data storage elements is used by the connected cluster controller as a spare data storage element;

first level correction means within each of said at least one of said plurality of cluster controllers for correcting errors detected in said first level redundancy group by using data and redundancy information stored in said data storage elements of said connected subset;

an array controller connected to said plurality of cluster controllers for controlling a second level redundancy group, wherein said second level redundancy group consists of said plurality of cluster controllers, wherein N of said plurality of cluster controllers are used by said array controller to store data, wherein M of plurality of cluster controllers are used by array controller to store redundancy information, and wherein at least one of said plurality of cluster controllers is used by array controller as a spare cluster controller; and second level correction means within said array controller for correcting errors detected in said second level redundancy group by using data and redundancy information stored in said plurality of cluster controllers.

2. The data storage subsystem of claim 1 wherein said first level correction means includes:

means for determining that an error detected in said first level redundancy group corresponds to a failed data storage element;

rebuild correction means, responsive to a determination that said errors do not correspond to a failed data storage element, for correcting errors detected in said first level redundancy group by rebuilding data corresponding to said detected errors; and replacement correction means, responsive to a determination that said errors correspond to a failed data storage element, for correcting errors detected in said first level redundancy group by replacement of said failed data storage element with a spare data storage element from said first level redundancy group and rebuilding of data on said spare data storage element.

3. The data storage subsystem of claim 1 wherein said second level correction means includes:

means for determining that an error detected in said second level redundancy group corresponds to a failed cluster controller;

rebuild correction means, responsive to a determination that said errors do not correspond to a failed cluster, for correcting errors detected in said second level redundancy group by rebuilding data corresponding to said detected errors; and replacement correction means, responsive to a determination that said errors correspond to a failed cluster controller, for correcting errors detected in said second level redundancy group by replacement of said failed cluster controller with a spare cluster controller from said second level redundancy group and rebuilding of data on said spare cluster controller.

* * * * *